United States Patent [19]

Chevroulet

[11] Patent Number: 5,473,635
[45] Date of Patent: Dec. 5, 1995

[54] DATA COMMUNICATION CIRCUIT

[75] Inventor: Michel Chevroulet, Neuchatel, Switzerland

[73] Assignee: CSEM, Neuchatel, Switzerland

[21] Appl. No.: 262,533

[22] Filed: Jun. 20, 1994

[30] Foreign Application Priority Data

Jun. 22, 1993 [FR] France ................................. 93 07673

[51] Int. Cl.[6] .............................. H04L 25/34; H03M 5/16
[52] U.S. Cl. .......................... 375/287; 375/219; 370/32; 341/56
[58] Field of Search ...................... 375/219, 222, 375/257, 286–287, 377; 370/32, 85.1; 341/56, 70–71

[56] References Cited

U.S. PATENT DOCUMENTS

| 4,493,092 | 1/1985 | Adams | 375/257 |
| 4,661,801 | 4/1987 | Chen et al. | 341/57 |
| 4,949,359 | 8/1990 | Voillat | 375/257 |

FOREIGN PATENT DOCUMENTS 0110179  6/1984  European Pat. Off. .

OTHER PUBLICATIONS

International Journal of Electronics vol. 67, No. 5, Nov. 1989, London GB pp. 809–817, XP87244 A. D. Singh "Precharged CMOS quaternary logic encoder–decoder circuits."

Primary Examiner—Young Tse
Attorney, Agent, or Firm—Griffin, Butler Whisenhunt & Kurtossy

[57]          ABSTRACT

A data communication circuit comprising a slave device (3), a master device (2) and a two-wire bus (6) wherein the master device (2) creates a potential difference (V(t)) between the two wires so as to provide power to the slave device (3). The slave device (3) comprises a pulse decoder (20) for detecting the pulses and producing a synchronisation signal (Clk) upon the detection of each pulse. The master device (2) also comprises a pulse control circuit (40) for causing the pulse creating circuit to create a series of data pulses having the same state when the digital information is read from the slave device (3). In addition, the slave device (3) further comprises a circuit (43,58) for changing the state of selected ones of the data pulses in the series in response to the digital information to be read.

16 Claims, 4 Drawing Sheets

DATA COMMUNICATION CIRCUIT

FIELD OF THE INVENTION

The present invention relates generally to data communication circuits comprising at least one slave device, a master device for controlling the operation of the slave device, and a two-wire bus connectable between the master device and the slave device for passing digital information therebetween, wherein the master device creates a potential difference between the two wires so as to provide power to the slave device. The invention is suitable for use in microcomputers having slave devices such as random-access-memory (RAM) devices for storing data and it will be convenient to hereinafter disclose the invention in relation to that exemplary application. It is to be appreciated, however, that the invention is not limited to this application.

PRIOR ART

Many existing electronic systems use one device to control the operation of others. A device which performs such a controlling function is known as a master, whilst a device which responds to the instructions of the master is known as a slave. A microcomputer provides an example of such a system. The central processing unit or CPU of a microprocessor executes a set of instructions. A read-only memory or ROM is used to store this set of instructions whilst a random-access memory or RAM is used to store variable data created and used by the CPU in the execution of these instructions. Data, address and control buses connect the CPU, ROM and RAM so as to allow communication therebetween.

When the CPU wishes to store data in the RAM, it sends a "write" command to the RAM as well as the data and the address at which the data is to be stored. The RAM then stores the data at the selected address. Similarly, when the CPU wishes to access data stored in the RAM, it sends a "read" command to the RAM and the address from which it wishes to access the data. The RAM correspondingly places the data from that address on the data bus for use by the CPU. The CPU thus acts as the master and controls the read/write operations of the RAM slave. The operation of the RAM is synchronised with that of the CPU by a clock signal placed on the control bus by the CPU.

In existing systems of this type, three separate multi-wire buses are often connected between the CPU and the RAM for the address, data and control information respectively to pass therebetween, as well as to provide the connection of a voltage supply to both the CPU and the RAM.

However, it is often desirable to minimize the hardware associated with the communication of digital information between the master and the slave. Some existing data communication circuits use only a single two-wire bus connected between a master and a slave. In such circuits, the two wires of the bus are used not only to transfer data between the master and the slave, but also to provide the power needed to drive the slave. The digital information sent from the master is used to modulate a carrier signal (either frequency or amplitude modulation) which is placed on the two-wire bus. The slave uses the potential difference created between the two wires of the bus by this modulated signal as a voltage supply and a time reference, so that it is able to demodulate the modulated signal and extract the digital information sent from the master.

In order to synchronise its operation with that of the master, a local time-base which must be synchronised with the time reference is required on the slave. This extra hardware requirement undesirably complicates the design of existing data communication circuits.

In addition, the modulation of the carrier signal by the digital information limits the bandwidth of the digital information which can be sent. According to the well-known Nyquist rule, the bandwidth, or in this case the bit transmission rate of the digital information, is limited to half the frequency of the carrier signal. This limitation is another problem which is desirable to avoid.

SUMMARY OF THE INVENTION

The object of the present invention is to provide a data communication circuit which alleviates or overcomes the disadvantages of known data communication circuits.

With this object in mind, the present invention provides a data communication circuit comprising at least one slave device, a master device for controlling the operation of said slave device, and a two-wire bus connectable between said master device and said slave device for passing digital information therebetween, said master device creating a potential difference between said two wires so as to provide power to said slave device, characterised in that said master device comprises pulse creating means for creating pulses in said potential difference, said pulses having an amplitude representative of said digital information, and said slave device comprises pulse decoding means for detecting said pulses and producing a synchronisation signal upon the detection of each said pulse.

A data communication circuit between the master and the slave is thus provided which carries information, power and synchronisation signals on two lines only, without requiring a local time-base on the slave. Further, the necessary bandwidth of the circuit is close to that of the bit transmission rate of the digital information sent between the master and the slave.

In one embodiment of the invention, the pulse creating means comprises means for creating a first data pulse having an amplitude less than a first predetermined value, or a second data pulse having an amplitude greater than said first predetermined value, said first data pulse being in one of a logically low or a logically high state and said second data pulse being in said other state. The master device may further comprise pulse control means for causing said pulse creating means to create a series of data pulses having the same state when said digital information is read from said slave device, and the slave device may further comprise means to change the state of selected ones of data pulses in said series in response to the digital information to be read.

The master device is thus able to read data from the slave device, for example, by placing logically low pulses on the data bus, selected ones of which are changed by the slave device into logically high pulses.

The following description refers in more detail to the various features of the data communication circuit of the present invention. In order to facilitate an understanding of the invention, reference is made in the description to the accompanying drawings where the data communication circuit is illustrated in a preferred embodiment. It is to be understood that the data communication circuit of the present invention is not limited to the preferred embodiment as illustrated in the drawings.

DESCRIPTION OF THE PREFERRED EMBODIMENT

Figure 1:
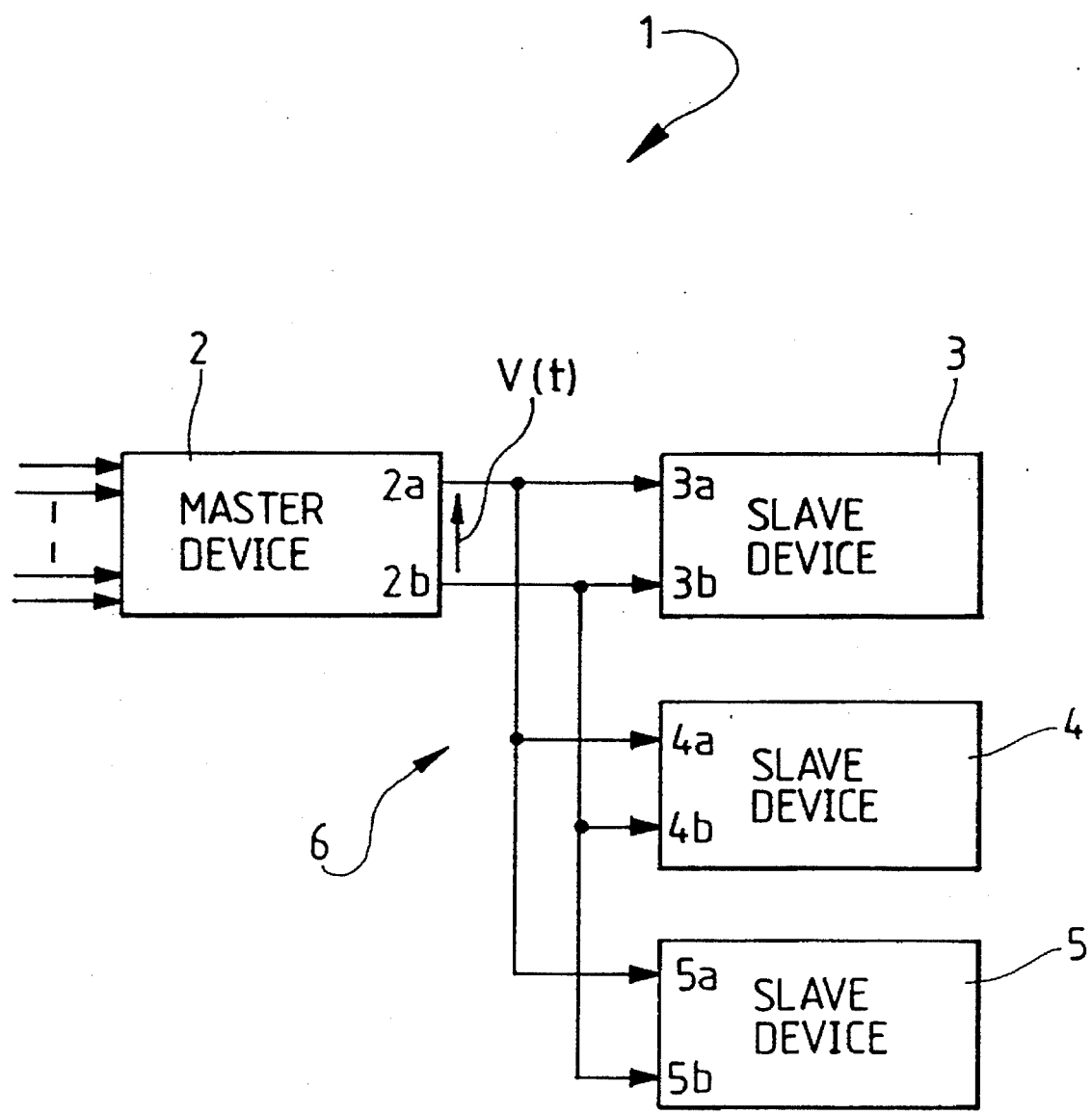
FIG. 1 is a schematic diagram of a data communication circuit according to the present invention.

Referring now to FIG. 1 of the drawings, there is shown a data communication circuit 1 having a master device 2 and three slave devices 3, 4 and 5. The master device 2 has two output terminals 2a and 2b, whilst the slave devices 3, 4 and 5 have input terminal pairs 3a and 3b, 4a and 4b and 5a and 5b respectively. A two-wire data bus 6 connects the input terminals of each slave device to the output terminals of the master. Although three slave devices are shown in FIG. 1, other embodiments of the present invention may include any number of slave devices.

Figure 2:
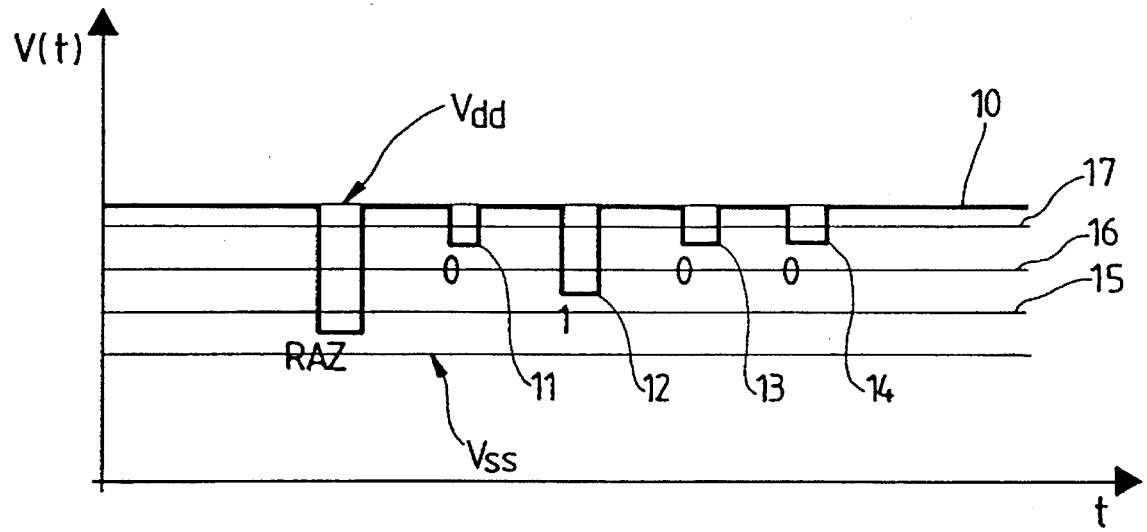
FIG. 2 is a schematic diagram of a communication protocol for use with the data communication circuit of FIG. 1.

FIG. 2 shows a graph of the potential difference V(t) appearing between the wires of the bus 6 as a function of time and represents a protocol by which digital information is transferred between the master device 2 and the slave devices 3, 4 and 5. The trace 10 of the potential difference V(t) represents the transmission of a reset pulse RAZ, followed by the digital pulses 11, 12, 13 and 14 representing the binary code 0,1,0,0. A potential difference V(t) equal to $(V_{dd}-V_{ss})$, where $V_{dd}$ and $V_{ss}$ are respectively "positive" and "negative" voltage supply levels which enable each slave device to operate, is placed on the bus 6 by the master 2 under steady state conditions i.e. when no information is being transferred between the master device and one of the slave devices. The actual values of $V_{dd}$ and $V_{ss}$ will depend upon the circuit design and technology used, and may adopt any suitable voltage levels.

The reset pulse RAZ and the data pulses 11, 12, 13 and 14 are realised as deviations in the steady state value of the potential difference V(t). In the embodiment shown, these deviations reduce the potential difference V(t), but in other embodiments the pulses may increase the voltage between the wires of the bus 6. As the energy available to provide power to the slave devices is a function of the duration and the period of the pulses shown in FIG. 2, the duration of these pulses is preferably small in comparison with the time-interval therebetween.

A multi-level protocol is used to effect the communication between the master device and the slave devices whereby the digital information is contained in the amplitude of the pulses. According to this protocol, a reset signal is communicated by placing a pulse on the bus 6, which pulse has an amplitude greater than a predetermined level 15. Similarly, a logical one is communicated by placing a pulse on the bus 6 which has an amplitude greater than a predetermined level 16 but smaller than the predetermined level 15. A logical zero is communicated by placing a pulse with an amplitude less than the predetermined level 16, but greater than a further predetermined level 17, on the bus 6.

It is to be appreciated that in other embodiments of the present invention, the amplitudes of the pulses may be representative other data. For example, a pulse having an amplitude less than the level 16 may represent a logical one, whilst a pulse having an amplitude greater than the level 16 may represent a logical zero.

Synchronisation between the master device and the slave devices is achieved by detecting the presence of each pulse placed on the bus 6 by the master 2. Each slave monitors the voltage across its pair of input terminals in order to detect when the potential difference V(t) falls below the difference between the voltage level 17 and $V_{ss}$. Regardless of whether the master device 2 places a logical one, a logical zero or a reset pulse on the bus 6, each slave thus detects the presence of that pulse and is able to use the series of pulses so detected as a clock signal.

Figure 3:
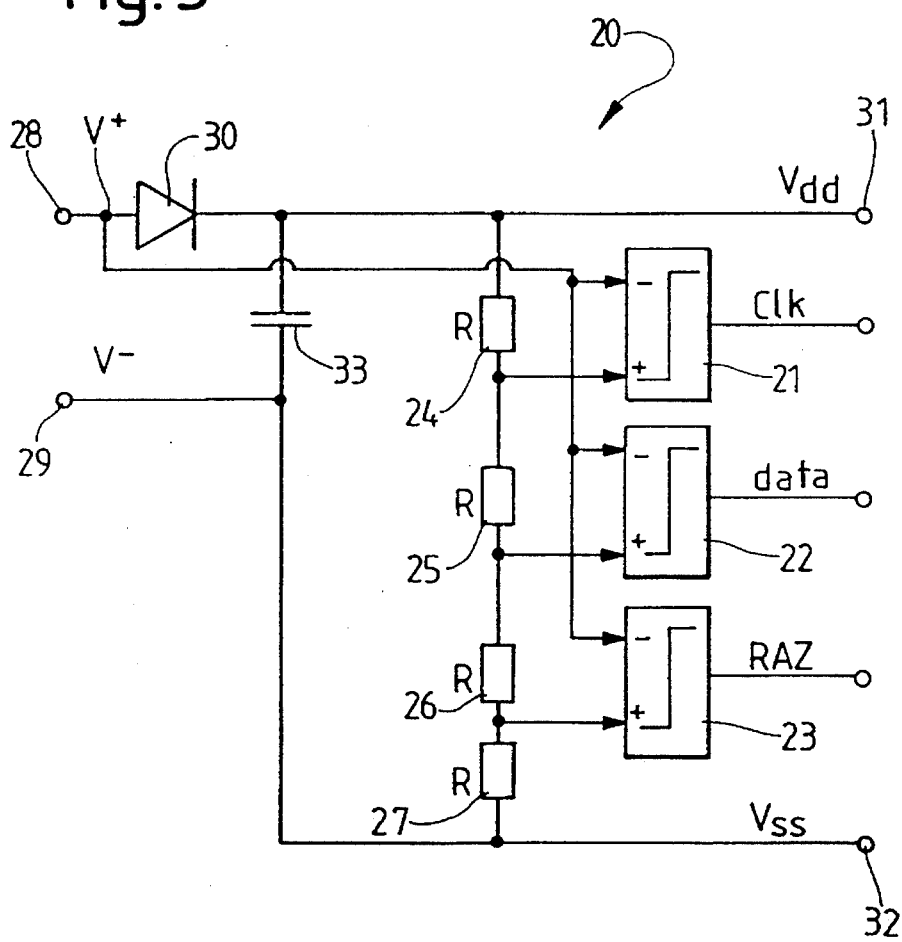
FIG. 3 is a circuit diagram of a pulse decoding means of the data communication circuit of FIG. 1.

FIG. 3 shows one example of a circuit which may be used by each slave device to decode the digital information conveyed by the pulses placed on the bus 6. The pulse decoder 20 comprises basically three comparators 21, 22 and 23 and four resistors 24, 25, 26 and 27. Each of the comparators has an inverting input and a noninverting input and provides a logically high output signal when the difference between its two inputs falls below a selected voltage. The pulse decoder 20 has two terminals 28 and 29 which are connected to the "positive" output terminal 2a and the "negative" output terminal 2b of the master device 2 respectively. The references V+ and V− indicate the temporal voltage of the terminals 2a and 2b respectively. The terminal 28 is connected via a protection diode 30 to a terminal 31 which supplies the voltage $V_{dd}$ in order to power each slave device. The terminal 29 is connected to the terminal 32 which supplies the voltage $V_{ss}$ to the slave devices. The terminal 29 is connected to the non-conducting input of the diode 30 via a capacitor 33 in order to maintain the potential difference V(t) at or near to $V_{dd}-V_{ss}$ in spite of the presence of pulses, such as those referenced 11 to 14 in FIG. 2, on the bus 6.

The terminal 28 is connected to the inverting input of each of the comparators. The resistors 24, 25, 26 and 27 have the same ohmic value R and are connected in series between the terminals 31 and 32 so as to form a voltage divider network. Each connection between adjacent resistors of the voltage divider network supplies the noninverting terminal of a different comparator. In this way, the comparators 21, 22 and 23 compare the voltage V+ at their inverting inputs to the voltages $¾(V_{dd}-V_{ss})+V_{ss}$, $½(V_{dd}+V_{ss})$ and $¼(V_{dd}-V_{ss})+V_{ss}$ respectively.

By way of an illustrative example, it will be assumed that when no digital information is being transferred between the master device and the slave devices, both V+ and $V_{dd}$ are 5 volts, that $V_{ss}$ is 1 volts, and that the voltage levels 17, 16 and 15 are 4, 3 and 2 volts respectively. Under these steady state conditions, the comparators 21, 22 and 23 each provides a logically low signal at its output.

It will further be assumed that the placement of a RAZ pulse on the bus causes the voltage V+ to drop to 1.5 volts. Similarly, it will be assumed that a data pulse representing a logical zero causes V+ to fall to 3.5 volts, and a data pulse representing a logical one causes V+ to fall to 2.5 volts.

Thus, when a data pulse representing a logical zero is present on the bus 6, the voltage difference between the inputs terminals of the comparators 21, 22 and 23 is now 0.5 volts, −0.5 volts and −1.5 volts respectively. Similarly, when a data pulse representing a logical one is present on the bus 6, the voltage difference between the inputs terminals of the comparators 21, 22 and 23 now becomes 1.5 volts, 0.5 volts and −0.5 volts respectively. Finally, when a reset signal is present on the bus 6, the voltage difference between the inputs terminals of the comparators 21, 22 and 23 now becomes 2.5 volts, 1.5 volts and 0.5 volts respectively.

Each comparator provides a logically high signal at its output when the potential difference between its input terminals drops below a selected threshold value. In the above example, a threshold value of 0 volts may be chosen for each comparator. It can be seen from the above that the use of this threshold value, results in this exemplary case, in the production of a "Clk" pulse by the comparator 21 every time a RAZ pulse, a logical one data pulse or a logical zero data pulse is placed on the bus. Similarly, the output of the comparator 22 goes logically high to produce a "data" pulse whenever a logical one pulse is placed on the bus, whilst the output of the comparator 23 only goes high to produce a "RAZ" pulse when a reset pulse is present on the bus.

Figure 4:
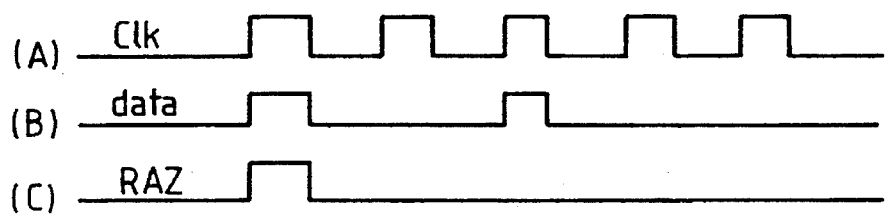
FIG. 4 is a schematic representation of the Clk, data and RAZ pulses created by the pulse decoding means of FIG. 3.

The Clk, data and RAZ pulses created by the pulse decoder 20 in response to the trace 10 shown in FIG. 2 are represented in FIG. 4. The Clk pulses thus enable the synchronisation of the operations performed by the master device and its slave devices, whilst the data pulses can be used by the system designer to signify either address, data or control bits for use in instructing a slave device to perform a desired operation. Further, the RAZ pulses can be used by the master to reset the slave devices.

Figure 5:
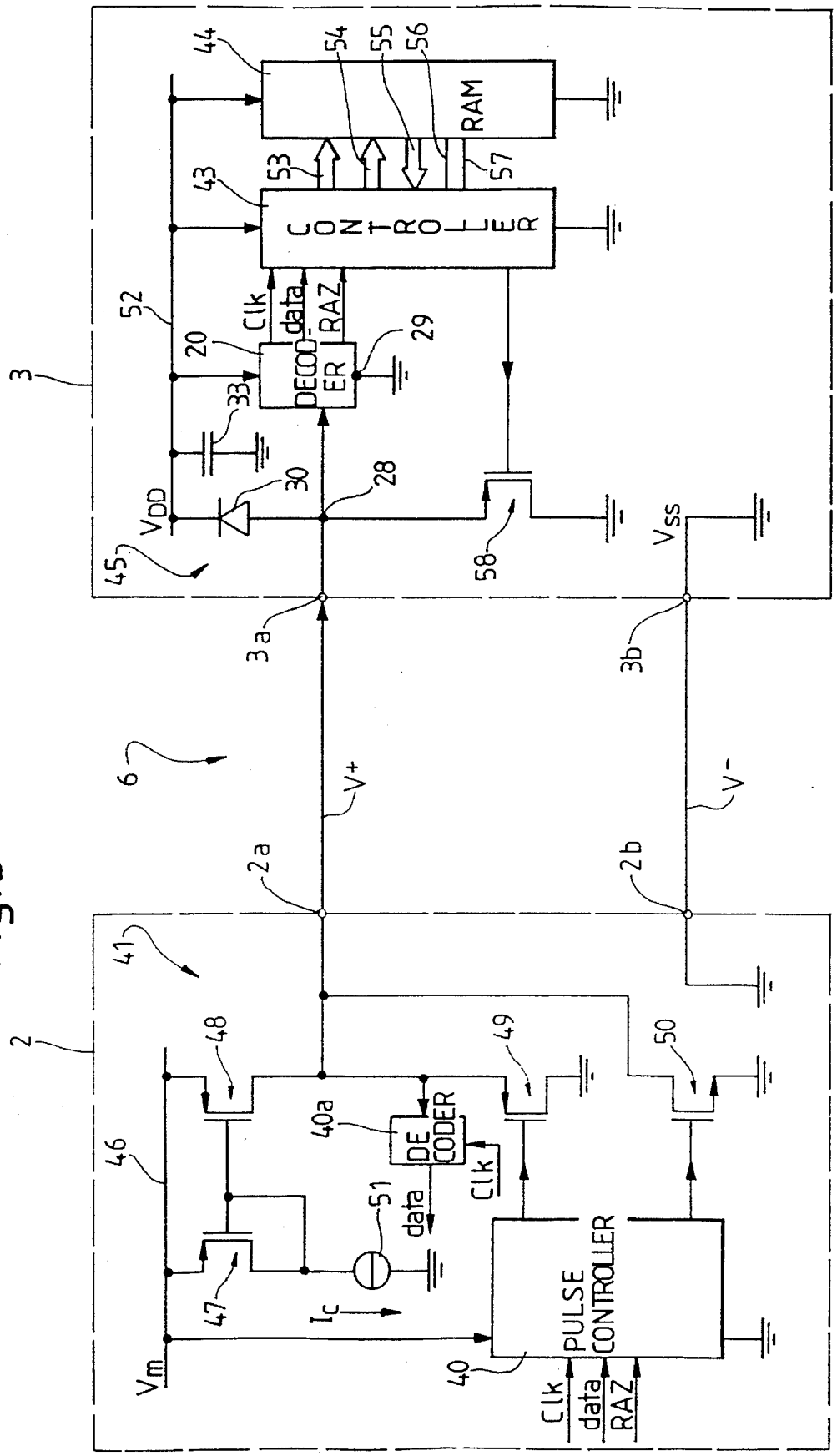
FIG. 5 is a schematic circuit diagram of the master device and one of the slave devices of the data communication circuit of FIG. 1; and, FIG. 6 is a representation of the form of the pulses created by the pulse decoding means of FIG. 3.

Referring now to FIG. 5, there is shown generally the master device 2, the slave device 3 and the bus 6 of FIG. 1. The master device 2 comprises a pulse controller 40, pulse creating means 41 and means 40a for decoding the information received from the slave device 3. The slave device 3 comprises a pulse decoder 20, a slave device controller 43, a RAM 44 and pulse state changing means 45. The master device 2 also comprises a positive supply rail 46 for providing a voltage $V_m$ to the pulse controller 40 and the pulse creating means 41.

The pulse creating means 41 comprises basically three p-channel and one n-channel enhancement type metal-oxide-semiconductor FETs (MOSFETs), referenced 47, 48, 49 and 50 respectively and a current source 51. The MOSFETs 47 and 48 and the current source 51 are connected together, between the positive supply rail 46 and an earth supply, in the configuration of a current mirror. The current flowing from the source to the drain of the MOSFET 48 is thus constant and proportional to the current $I_c$ produced by the current source 51, in spite of any change in voltage between its drain and source. The drain of the MOSFET 48 is connected to the source of the MOSFET 49 and to the drain of the MOSFET 50. The gates of the MOSFETs 49 and 50 are both connected to the pulse controller 40, whilst the drain of the MOSFET 49 and the source of the MOSFET 50 are connected to the earth supply. The drain of the MOSFET 48 is connected to a first wire of the bus 6 via the terminal 2a. The second wire of the bus 6 is connected to the earth supply of the master device 2.

A positive power supply rail 52 of the slave device 3 is connected to the first wire of the bus 6 via the diode 30 and the terminal 3a. The rail 52 supplies power to the pulse decoder 20, the slave device controller 43 and the RAM 44. As explained above, the capacitor 33 is connected between the rail 52 and earth in order to maintain the voltage supplied to the slave device 3 at or near a constant level of $V_{dd}-V_{ss}$. The pulse decoder 20 is connected to the slave device controller 43 by its Clk, data and RAZ terminals outputs, as shown in FIG. 5. The slave device controller 43 is connected to the RAM 44 by an address bus 53, a bus 54 for writing data to the RAM 44, a bus 55 for reading data from the RAM 44, a read-enable connection 56 and a write enable connection 57.

It should be noted that in this exemplary arrangement, the terminals 2b and 3b are both connected to earth and consequently the voltages V− and $V_{ss}$ are both fixed at 0 volts.

The pulse state changer 45 comprises basically an p-channel enhancement type MOSFET 58 having its source connected to the terminal 3a, its drain connected to the earth supply and its gate connected to the slave device controller 43.

In steady state conditions, when no data is being transferred between the master device 2 and the slave device 3, the pulse controller 40 applies a negative voltage to the gate of the MOSFET 49, thus causing it to conduct. Under these conditions, the voltage applied to the gates of the MOSFETs 50 and 58 are such as to render them non-conductive. The constant current flowing from the source to the drain of the MOSFET 48 thus flows through the MOSFET 49. By controlling the gate-source voltage of the MOSFET 49, the voltage between its drain and source, and hence the voltage between the two wires of the bus 6, may be set to a desired value. For example, the pulse controller 40 may provide a negative voltage to the gate of the MOSFET 49 such that a voltage V+ of 4 volts is produced at the terminal 2a. A voltage $V_{dd}$ of 4 volts is therefore also provided to provide power to the slave device 3.

When the master device 2 wishes to send data to the slave device 3, the voltage applied to the gates of either of the MOSFETs 49 or 50 is altered. If a logical zero is to be sent, the voltage applied to the gate of the MOSFET 49 is sufficiently lowered, during the period of one pulse, for the voltage between its source and drain to fall to between the levels 17 and 16 of FIG. 2. When a logical one is to be sent, the voltage applied is further lowered, during the period of one pulse, so that the source-drain voltage falls to between the levels 16 and 15 of FIG. 2.

When a reset pulse is to be sent, a negative voltage pulse is applied to the gate of the MOSFET 50, causing it to conduct for the duration of that pulse. The magnitude of the pulse is such as to cause the voltage between the drain and source of the MOSFET 50 to drop below the level 15 of FIG. 2. In this case, it it the MOSFET 50 and not the MOSFET 49 which controls the voltage V+ at the terminal 2a of the master device 2.

The logical zero, logical one and reset pulses thus created in the potential difference between the wires of the bus 6, are received and decoded by the pulse decoder 20, as explained in relation to FIG. 3. The Clk, data and RAZ signals provided from the pulse decoder 43 are supplied to the slave device controller 43 for controlling the operation of the RAM 44. The slave device controller 43 may comprise elements such as shift registers, logic gates and D-latches for storing and interpreting the data signals sent from the pulse decoder and performing desired read/write operations to and from the RAM 44 via the buses 53, 54 and 55.

When the master device 2 wishes to read data from the slave device 3, it firstly sends a series of logical one and logical zero pulses to the slave device 3 which will be interpretted thereby as a command to read data from a specified address in the RAM 44. The slave device controller 43 then retrieves and stores the data to be sent in a shift-register or other internal storage device. The master device 2 subsequently sends a series of "0"'s which are used as a clock by the slave device 3.

When the slave device 3 subsequently communicates the data retrieved from the RAM 44, the pulse controller 40 controls the voltage applied to the base of the MOSFET 49 so that a series of logically low pulses are created in the potential difference between the wires of the bus 6. If the bits of data to be communicated to the master device 2 are logical zeros, the slave device does not alter the pulses.

The decoding means 40a enable the reading of the information sent by the slave device 3. These means may comprise a comparator circuit which compares the level of the voltage received to a given threshold value.

However, if a bit of data to be communicated is a logical one, the slave device controller 3 applies a negative voltage pulse to the base of the MOSFET 58 so that the voltage drop between its drain and source falls to a value between the levels 16 and 15 of FIG. 2 for the duration of the pulse. The slave device 3 thus changes a logically low pulse into logically high pulse each time a bit of data to be read by the master is a logical one.

It can be seen that when data from the slave device 3 is being read by the master device 2, the impedance between the two wires of the bus 6, and the voltage V+, is controlled by the current flowing through the MOSFET 48 and one of the two MOSFETs 49 and 50, whichever has the lowest voltage applied to its gate. In the exemplary arrangement shown in FIG. 5, the impedance of the bus 6 is controlled by the use of non-linear impedances (the MOSFETs 49, 50 and 58). However, in other embodiments of the present invention linear impedances such as fixed and/or variable resistors may be used. The slave device controller 43, for example, may selectively connect such resistors to the terminal 3a of the slave device 3 in order to alter the bus impedance and thus change the state of selected data pulses placed on the bus 6 by the master device 2.

Figure 6:
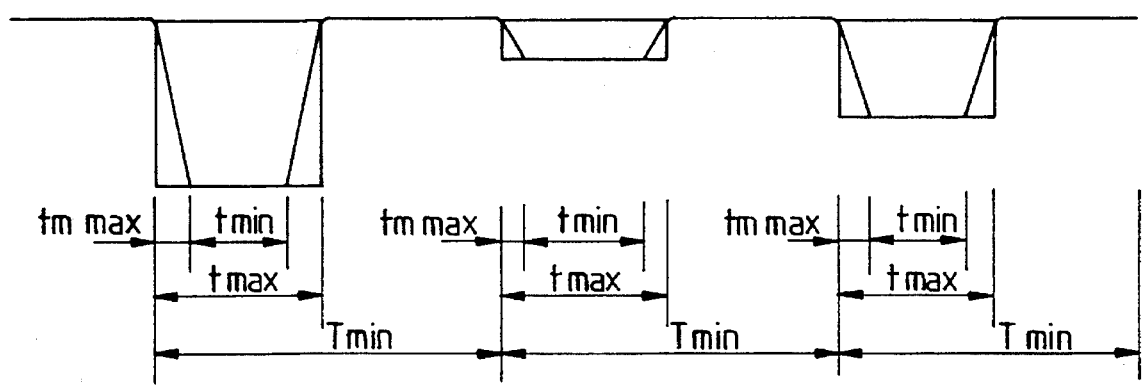

As will be appreciated by those skilled in the art, the actual Clk, data and RAZ pulses produced by the decoder 20 will not be as shown in FIG. 4, but rather will have certain measurable rise and fall times. FIG. 6 shows schematically the maximum rise time $tm_{max}$ and the minimum pulse duration $t_{min}$ of pulses produced by the pulse decoder 20. As each of the pulses from the pulse decoder 20 are initiated at the same time, errors may arise if a slave device reads the data and RAZ pulses on the leading edge of the Clk pulses. In order to enable a slave to so read the data and RAZ pulses from the pulse decoder 20 free from parasites, the Clk pulses may therefore be delayed by an amount greater khan $tm_{max}$ and less than $(tm_{max}+t_{min})$.

FIG. 6 also shows schematically the maximum pulse duration $t_{max}$ and the minimum pulse period $T_{min}$. The energy available to power the slave devices is a function not only of the amplitude of the pulses on the bus 6, but also of the relation between $t_{max}$ and $T_{min}$. A system designer may therefore chose to specify $t_{max}$ and $T_{min}$, depending on the power requirements of the slave devices used in a particular application. For example, the pulses may have a duration $t_{min}$ which is less than half of their period $T_{min}$.

Finally, it is to be understood that various modifications and/or additions may be made to the data communication circuit without departing from the ambit of the present invention as defined in the claims appended hereto.

I claim:

1. Data communication circuit comprising at least one slave device, a master device for controlling the operation of said slave device, and a two-wire bus connectable between said master device and said slave device for passing digital information therebetween, said master device creating a potential difference (V(t)) between said two wires so as to provide power to said slave device, said master device comprising pulse creating means for creating pulses in said potential difference (V(t)), said pulse creating means comprising means for creating a first data pulse having an amplitude less than a first predetermined value, and a second data pulse having an amplitude greater than said first predetermined value, said first data pulse being in one of a logically low or a logically high state and said second data pulse being in a logically low or a logically high state different from the state of said first data pulse, said slave device comprising pulse decoding means for detecting said pulses and producing a synchronization signal (Clk) upon the detection of each said pulse, characterized in that said master device further comprises pulse control means for causing said pulse creating means to create a series of said data pulses having the same state when said digital information is read from said slave device, and said slave device further comprises means to change the state of selected ones of data pulses in said series in response to the digital information to be read.

2. Data communication circuit according to claim 1, characterized in that the state changing means comprises means to alter the impedance between the two wires of said bus during said selected pulses.

3. Data communication circuit according to claim 2, characterized in that said pulse creating means further comprises means for creating a reset pulse having an amplitude greater than a second predetermined value.

4. Data communication circuit according to claim 2, characterized in that said pulse decoding means comprises means for producing an information signal (data) having one of a logically low level or a logically high level upon detection of any of said pulses having the amplitude less than said first predetermined value, and having another of said logically low level or said logically high level upon detection of a pulse having the amplitude greater than said first predetermined value.

5. Data communication circuit according to claim 2, characterized in that each said pulse causes a reduction in said potential difference (V(t)).

6. Data communication circuit according to claim 1, characterized in that said pulse creating means further comprises means for creating a reset pulse having an amplitude greater than a second predetermined value.

7. Data communication circuit according to claim 6, characterized in that said second predetermined value is greater than said first predetermined value.

8. Data communication circuit according to claim 7, characterized in that said pulse decoding means comprises means for producing an information signal (data) having one of a logically low level or a logically high level upon detection of any of said pulses having the amplitude less than said first predetermined value, and having another of said logically low level or said logically high level upon detection of a pulse having the amplitude greater than said first predetermined value.

9. Data communication circuit according to claim 7, characterized in that each said pulse causes a reduction in said potential difference (V(t)).

10. Data communication circuit according to claim 6, characterized in that said pulse decoding means comprises means for producing an information signal (data) having one of a logically low level or a logically high level upon detection of any of said pulses having the amplitude less than said first predetermined value, and having another of said logically low level or said logically high level upon detection of a pulse having the amplitude greater than said first predetermined value.

11. Data communication circuit according to claim 6, characterized in that each said pulse causes a reduction in said potential difference (V(t)).

12. Data communication circuit according to claim 1, characterized in that said pulse decoding means comprise means for producing an information signal (data) having one of a logically low level or a logically high level upon detection of any one of said pulses having the amplitude less than said first predetermined value, and having another one of said logically low level or said logically high level upon detection of a pulse having the amplitude greater than said first predetermined value.

13. Data communication circuit according to claims 12, characterized in that said pulse decoding means further comprises means for producing a reset signal (RAZ) upon detection of any one of said pulses having an amplitude greater than said second predetermined value.

14. Data communication circuit according to claim 13, characterized in that each said pulse causes a reduction in said potential difference (V(t)).

15. Data communication circuit according to claim 12, characterized in that each said pulse causes a reduction in said potential difference (V(t)).

16. Data communication circuit according to claim 1, characterized in that each said pulse causes a reduction in said potential difference (V(t)).

* * * * *